United States Patent
Dieny et al.

(10) Patent No.: US 8,947,916 B2
(45) Date of Patent: Feb. 3, 2015

(54) THERMALLY ASSISTED MAGNETIC WRITING DEVICE

(75) Inventors: Bernard Dieny, Lans en Vercors (FR); Jerome Moritz, Saint Pierre de Bressieux (FR); Ricardo Sousa, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 91 days.

(21) Appl. No.: 13/876,390

(22) PCT Filed: Sep. 29, 2011

(86) PCT No.: PCT/FR2011/052275
§ 371 (c)(1),
(2), (4) Date: Jun. 5, 2013

(87) PCT Pub. No.: WO2012/042178
PCT Pub. Date: Apr. 5, 2012

(65) Prior Publication Data
US 2013/0250671 A1    Sep. 26, 2013

(30) Foreign Application Priority Data
Oct. 1, 2010  (FR) ...................................... 10 57985

(51) Int. Cl.
| | |
|---|---|
| *G11C 11/00* | (2006.01) |
| *G11C 11/16* | (2006.01) |
| *H01F 10/32* | (2006.01) |
| *H01L 43/08* | (2006.01) |

(52) U.S. Cl.
CPC ............ *G11C 11/1675* (2013.01); *G11C 11/16* (2013.01); *H01F 10/3218* (2013.01); *H01F 10/3268* (2013.01); *H01L 43/08* (2013.01); *H01F 10/3272* (2013.01)
USPC ........................................... 365/158; 365/148

(58) Field of Classification Search
USPC ........................................................ 365/158
See application file for complete search history.

(56) References Cited

U.S. PATENT DOCUMENTS

| | | | | |
|---|---|---|---|---|
| 6,381,105 | B1 * | 4/2002 | Huai et al. ..................... | 360/314 |
| 2006/0098354 | A1 | 5/2006 | Parkin | |

(Continued)

FOREIGN PATENT DOCUMENTS

| | | |
|---|---|---|
| FR | 2 817 999 | 6/2002 |
| FR | 2 924 851 | 6/2009 |
| WO | WO 2009/074411 | 6/2009 |

OTHER PUBLICATIONS

International Search Report as issued for PCT/FR2011/052275.

*Primary Examiner* — Anthan Tran
(74) *Attorney, Agent, or Firm* — Pillsbury Winthrop Shaw Pittman LLP

(57) ABSTRACT

A thermally assisted magnetic writing device including a first magnetic layer known as the "reference layer," a second magnetic layer known as the "storage layer" that presents a variable magnetization direction, a spacer situated between the reference layer and the storage layer and a first antiferromagnetic layer in contact with the storage layer, the first antiferromagnetic layer being able to trap the magnetization direction of the storage layer. The magnetic device also includes a stabilization layer made of a ferromagnetic material, the stabilization layer being in contact with the first antiferromagnetic layer.

17 Claims, 2 Drawing Sheets

(56) References Cited

U.S. PATENT DOCUMENTS

Figure 5:
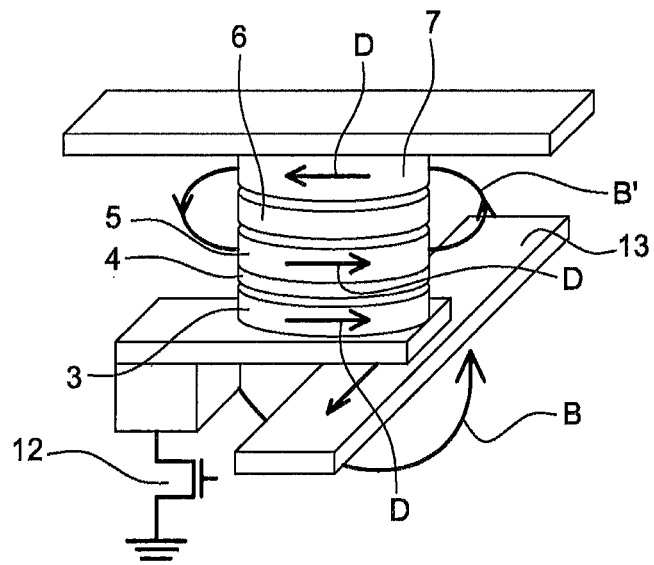

| | | |
|---|---|---|
| 2007/0096229 A1 | 5/2007 | Yoshikawa et al. |
| 2008/0247072 A1* | 10/2008 | Nozieres et al. ............... 360/59 |
| 2010/0090300 A1 | 4/2010 | Xi et al. |
| 2010/0110783 A1* | 5/2010 | Liu et al. ....................... 365/171 |
| 2010/0246254 A1* | 9/2010 | Prejbeanu et al. ............ 365/171 |
| 2011/0007561 A1* | 1/2011 | Berger et al. ................. 365/171 |

* cited by examiner

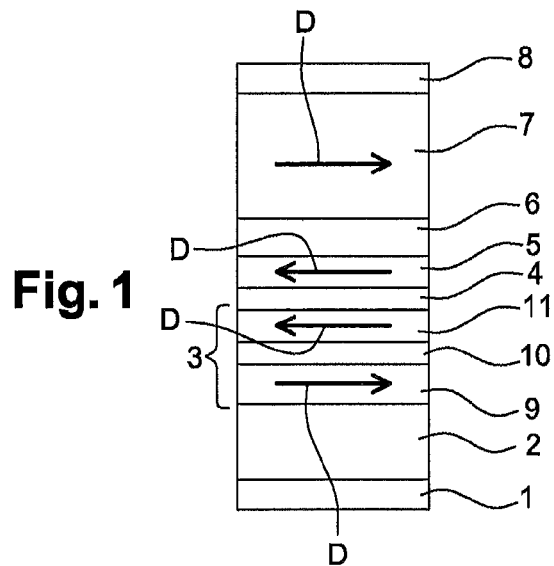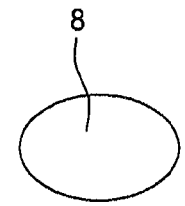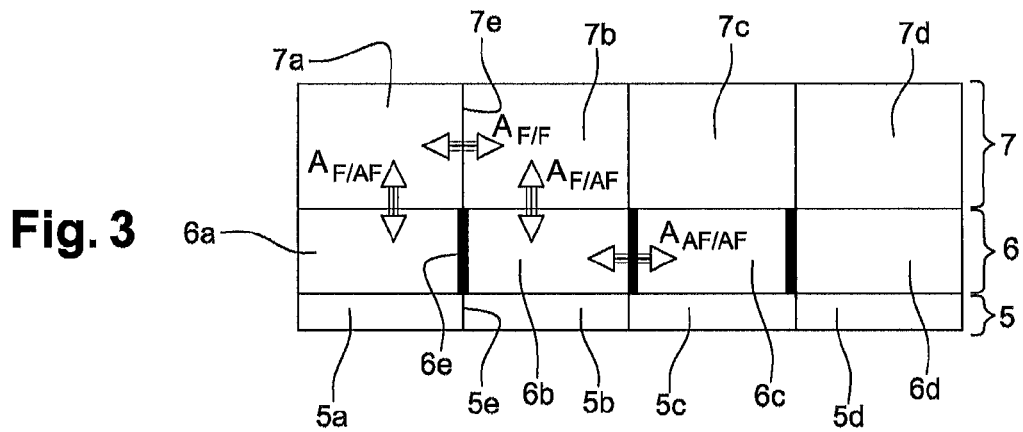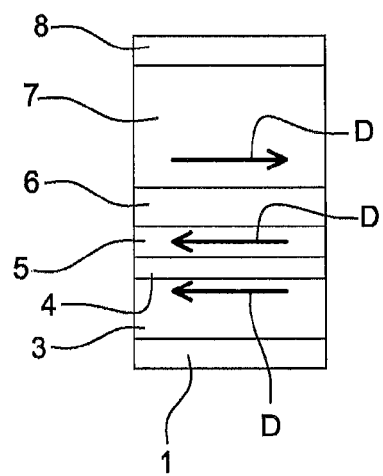

THERMALLY ASSISTED MAGNETIC WRITING DEVICE

CROSS-REFERENCE TO RELATED APPLICATIONS

This is the U.S. National Stage of PCT/FR2011/052275, filed Sep. 29, 2011, which in turn claims priority to French Patent Application No. 1057985, filed Oct. 1, 2010, the entire contents of all applications are incorporated herein by reference in their entireties.

The present invention relates to a thermally assisted magnetic writing device.

The invention finds an application in electronics and particularly in producing memory points and MRAM (Magnetic Random Access Memory) type memory.

There has been increased interest in MRAM magnetic memories with the development of magnetic tunnel junctions presenting high magnetoresistance at ambient temperature. MRAM memories comprise several memory points. These memory points generally are magnetic devices that comprise:

a magnetic layer called a "reference layer" that presents magnetization with a pinned direction;

a magnetic layer called a "storage layer" that presents magnetization in which the direction is variable and that may be oriented either in parallel or antiparallel to the magnetization direction of the reference layer;

a spacer made of an insulating or semiconductor material that separates the reference layer from the storage layer.

For example, document FR2817999 describes such a magnetic device. This magnetic device presents two modes of operation: a "reading" mode and a "writing" mode. During writing mode, an electron current or a magnetic field is sent through the layers, so as to reverse the direction of magnetization of the storage layer, that then becomes parallel or antiparallel to the direction of magnetization of the reference layer. Depending on whether the direction of magnetization of the storage layer is parallel or antiparallel to the direction of magnetization of the reference layer, a "1" or a "0" is stored in the storage layer.

During reading mode, an electron current is injected through the magnetic device so as to read its resistance. When the magnetization directions of the reference layer and storage layer are parallel, the junction resistance is low, while when the magnetization directions of the reference layer and storage layer are antiparallel, the junction resistance is high. By comparison with the reference resistance, the value stored in the storage layer ("0" or "1") may be determined.

In addition, document FR2924851 proposes adding to the device described previously an antiferromagnetic layer in contact with the storage layer. In reading mode, this antiferromagnetic layer enables the magnetization direction of the storage layer to be pinned so that the information stored in the storage layer does not vary. In writing mode on the other hand, the antiferromagnetic layer is heated so that it becomes paramagnetic or at least so that its temperature exceeds the aforesaid blocking temperature of the antiferromagnetic layer. This blocking temperature is generally lower than the Néel temperature of the antiferromagnetic material but it moves increasingly closer to the Néel temperature as the heating duration shortens to durations on the order of some nanoseconds. The Néel temperature of the antiferromagnetic material is the temperature at which the antiferromagnetic order disappears and above which the material behaves as a paramagnetic material. When the temperature of the antiferromagnetic layer exceeds the blocking temperature, the magnetization direction of the storage layer may then be modified since it is no longer pinned by the antiferromagnetic layer. Once the magnetization direction of the storage layer has been modified, the antiferromagnetic layer heating is stopped. The antiferromagnetic layer then becomes antiferromagnetic again. The magnetization direction of the storage layer is then pinned in the direction in which it is found after the writing process. The magnetic devices that comprise such an antiferromagnetic layer and implement temporary heating of this layer when writing information are part of the devices known as "thermally assisted writing" devices.

Thermally assisted writing magnetic devices are advantageous since they reduce the risk of accidental writing when reading the information contained in the storage layer. In addition, they have better retention than devices that do not implement thermal assistance, i.e., they have a better capacity for maintaining the written information over time.

However, in these thermally assisted writing devices, a significant density of structural defects is observed due to the structural incompatibility between the antiferromagnetic layer, that generally presents a face-centered cubic crystal structure, and the storage layer, that generally presents a body-centered cubic crystal structure when it is in contact with a tunnel barrier of MgO. These structural defects have a direct impact on the pinning quality of the storage layer by the antiferromagnetic layer.

To remedy these disadvantages, document FR2924851 proposes adding, in the storage layer, an amorphous or quasi-amorphous layer, for example in tantalum, as well as a ferromagnetic layer with a face-centered cubic crystal structure, for example in NiFe permalloy. The addition of these layers allows a structural transition between the antiferromagnetic layer and the layers that present a body-centered cubic crystal structure to be made.

However, thermally assisted magnetic writing devices from the prior art present many disadvantages when their lateral size is reduced. First of all, when the lateral size of the magnetic devices from the prior art is reduced, the coercivity of the storage layer increases such that the writing of the storage layer becomes more difficult.

In addition, when the size of the thermally assisted writing devices from the prior art reduces, the stability of the antiferromagnetic layer reduces, as well as the pinning of the storage layer by the antiferromagnetic layer. In fact, the antiferromagnetic layer presents a polycrystalline granular structure and the grains constituting the layer are weakly magnetically coupled between each other. Such being the case, when one reduces the size of the magnetic device, the proportion of grains of the antiferromagnetic layer that are situated at the periphery of the antiferromagnetic layer is increased. In addition, these grains at the periphery are partly cropped by the etching process, which has the effect of making their magnetization less stable. They may even be described as magnetically unstable when the cropped part exceeds a certain percentage of the initial grain surface. As the size of the device reduces, the size distribution of the grains constituting the antiferromagnetic layer tends to enlarge. The result is very significant fluctuations in the pinning properties from one device to the other, and in the magnetic memory example, from one memory point to the other. Thus, when small size devices from the prior art are etched, the volume of these peripheral grains reduces, which leads to a reduction in the magnetic coherence of the antiferromagnetic layer. This reduction in the magnetic coherence of the antiferromagnetic layer leads to a more or less high reduction in the pinning quality of the storage layer by the antiferromagnetic layer and an increase in the dispersion of the pinning properties from one point to the other.

The invention aims to at least partially remedy the disadvantages from the prior art by proposing a thermally assisted magnetic writing device whose size may be reduced without the stability of the antiferromagnetic layer, and thus the stability of the storage layer in reading, being reduced.

Another object of the invention is to propose a thermally assisted magnetic writing device in which the writing of the storage layer is facilitated.

Another object of the invention is to propose a magnetic device in which the reading of information contained in the storage layer is facilitated.

To do this, the invention proposes a thermally assisted magnetic writing device comprising:
- a first magnetic layer known as a "reference layer,"
- a second magnetic layer known as a "storage layer," the storage layer presenting a variable magnetization direction,
- a spacer situated between the reference layer and the storage layer,
- a first antiferromagnetic layer in contact with the storage layer, the first antiferromagnetic layer being able to pin the magnetization direction of the storage layer;

The magnetic device being characterized in that it also comprises a stabilization layer made in a ferromagnetic material, the stabilization layer being in contact with the first antiferromagnetic layer by its face opposite to the storage layer.

Thus, according to the invention, the magnetic cohesion of the first antiferromagnetic layer is increased by increasing the effective coupling between the constituent grains of the antiferromagnetic layer. To do this, the invention proposes adding a stabilization layer in a ferromagnetic material in contact with the first antiferromagnetic layer. The presence of this stabilization layer in a ferromagnetic material reinforces the grain-to-grain coupling inside the first antiferromagnetic layer. In fact, when the first layer in an antiferromagnetic material is on its own, the grains constituting it are very weakly coupled between each other. On the other hand, in a layer in a ferromagnetic material, the grains are very strongly coupled to each other. When a ferromagnetic layer and an antiferromagnetic layer are put in contact, the magnetization of the ferromagnetic layer grains tends to align with the last interfacial spin plane of the grains from the antiferromagnetic material layer. The result is that each grain from the ferromagnetic layer is strongly magnetically coupled with the grain from the antiferromagnetic layer with which it is in contact. In addition, the grains from the stabilization layer in a ferromagnetic material are very strongly coupled between each other, such that the grains from the first antiferromagnetic layer also become coupled between each other, through the grains from the ferromagnetic layer. The stabilization layer thus enables the magnetic cohesion of the first antiferromagnetic layer to be increased by indirectly inducing coupling between grains inside the antiferromagnetic layer. Thus, in a highly submicronic device with a lateral dimension, the grains situated at the periphery of the device that initially were unstable are found to be stabilized by this direct intergrain coupling. The result is that this stabilization layer increases the exchange coupling between the first antiferromagnetic layer and the storage layer. Thus outside of the writing event, i.e., as the antiferromagnetic layer is not heated above its blocking temperature, pinning of the storage layer by the adjacent antiferromagnetic layer remains effective even for highly submicronic devices with lateral dimensions.

The magnetic device according to the invention may also present one or more of the characteristics below, considered individually or according to all technically possible combinations.

In this document, the "magnetic moment" of a magnetic layer is the product of the magnetization of this magnetic layer by the thickness of this magnetic layer.

Advantageously, the stabilization layer presents a higher magnetic moment than the magnetic moment of the storage layer.

To do this, the stabilization layer preferably presents a thickness greater than the thickness of the storage layer.

In this case, the stabilization layer enables writing of the storage layer thanks to a magnetic field. This magnetic field may for example be created by a conductor crossed by a current such as the case in MRAM magnetic memories with magnetic field writing. When a magnetic field pulse is applied to the magnetic device, this magnetic field enables the magnetization direction of the stabilization layer to first be oriented, since this layer presents the highest magnetic moment. The stabilization layer then radiates a leakage magnetic field by the edges of the device that tends to align the magnetization direction of the storage layer antiparallel with relation to the magnetization direction of the stabilization layer. The stabilization layer thus acts as a "lever" that enables a leakage magnetic field to be created that is higher than the initial magnetic field so as to cause the magnetization direction of the storage layer to be reversed.

Advantageously, the stabilization layer presents a thickness of between 5 and 20 nm.

Advantageously, the storage layer presents a thickness of between 1 and 4 nm.

Thus, if the stabilization and storage layers are constituted of identical or similar magnetization materials, the stabilization layer presents a magnetic moment that is substantially higher than the storage layer and it may thus act as an amplifier of the magnetic field applied to the storage layer. If the magnetizations of the stabilization and storage layers are different, the above reasoning applies to the magnetic moments and not directly to the thicknesses of the stabilization and storage layers.

Advantageously, the stabilization layer presents a variable magnetization direction, the magnetic device also comprising means for emitting a magnetic field able to modify the magnetization direction of the stabilization layer. In fact, in the magnetic device according to the invention, modifying the magnetization direction of the storage layer by magnetic field through the stabilization layer is particularly advantageous.

According to an embodiment, the magnetic field emitting means may comprise a conductor in which an electrical current passes. This conductor may be coated on some of its faces by a soft magnetic material enabling the field created at the level of the stabilization layer to be increased. This technology is known by the term "cladding" in the context of MRAM magnetic memories with magnetic field writing.

Advantageously, the magnetic device according to the invention presents an elliptic section along the plane of the layers or more generally presents shape anisotropy in its plane leading to an easy magnetization direction in the plane of layers along the largest dimension of the magnetic layers under consideration of the magnetic device. In particular, the stabilization layer preferably presents an elliptic section. The fact of having a stabilization layer of elliptic section or at least presenting planar shape anisotropy prevents the stabilization layer from entering the vortex state.

According to a first embodiment, the reference layer presents a magnetization direction pinned by a second antiferromagnetic layer disposed in contact with the reference layer.

In this case, the second antiferromagnetic layer must present a Néel temperature higher than the Néel temperature of the first antiferromagnetic layer.

In this document, "Néel temperature" is the temperature above which an antiferromagnetic material becomes paramagnetic.

The fact of having a Néel temperature for the second antiferromagnetic layer higher than the Néel temperature of the first antiferromagnetic layer enables the first antiferromagnetic layer to be heated so as to be able to modify the magnetization direction of the storage layer, while remaining at a temperature lower than the Néel temperature of the second antiferromagnetic layer, such that the magnetization direction of the reference layer remains blocked by the second antiferromagnetic layer.

In reading mode, a current is injected in the magnetic device and the resistance of the magnetic device is measured. Next this value is compared to a standard reference value. If the resistance of the magnetic device is less than the standard reference value, this means that the reference and storage layers present parallel magnetization directions. On the other hand, if the resistance measured for the device is higher than the standard reference value, this means that the reference and storage layers present antiparallel magnetization directions. As the magnetization direction of the reference layer is pinned, it is then easy to deduce the magnetization direction of the storage layer and thus the value contained in the storage layer.

According to a second embodiment, the reference layer presents a variable magnetization direction. The fact of having a reference layer whose magnetization direction is variable is possible, since, according to the invention, the reference layer is not necessary to modify the magnetization direction of the storage layer. In fact, as explained previously, according to the invention, the magnetization direction of the storage layer is modified by application of a magnetic field pulse that either acts directly on the magnetization of the storage layer, or acts on the magnetization of the stabilization layer that in turn, by its field radiated on the storage layer, acts on the magnetization of the storage layer. Consequently, the orientation of the magnetization of the reference layer at the time of writing has minimal impact on the writing process. Thus the reference layer may present a variable magnetization direction, which presents many advantages. First of all, the choice of antiferromagnetic material to make the first antiferromagnetic layer is not limited by the Néel temperature of the second antiferromagnetic layer. In addition, the fact of having a reference layer whose magnetization direction is variable is particularly advantageous in reading mode. In fact, in this case, it is possible to make a differential reading of the information contained in the storage layer by using the reference layer. To do this, the resistance of the magnetic device is compared for two different orientations of the magnetization direction of the reference layer. To do this, the invention orients, with a first magnetic field pulse, the magnetization direction of the reference layer in a predetermined direction. This modification in the magnetization direction of the reference layer takes place without heating, i.e., with a reading current crossing the tunnel junction that is sufficiently weak so as to heat very little, i.e., well below its Néel temperature, the junction and thus does not modify the magnetization direction of the storage layer. Then the resistance of the magnetic device is measured. Next a second magnetic field pulse is applied to the device, still without heating, so as to orient the magnetization direction of the reference layer in the direction opposite from the first predetermined direction. Then the resistance of the magnetic device is again measured. After each current pulse, the magnetization direction of the reference layer is known since the direction of the applied magnetic field pulses is known. Consequently, by comparing the resistance of the magnetic device after the first current pulse and after the second current pulse, the magnetization direction of the storage layer is deduced. This reading mode of the magnetic device is particularly advantageous since it enables a more precise reading of the information contained in the storage layer. In fact, the values of the resistances when the reference and storage layers are parallel or antiparallel may vary from one magnetic device to the other. Consequently, when the resistance of a magnetic device is compared to a standard reference value, the result of the comparison is sometimes not representative of the real state of the magnetic device due to the fact of the differences between this magnetic device and the magnetic device that enabled the standard reference value to be established. On the other hand, with this second embodiment, the standard reference value is no longer used, but a same magnetic device is placed in two states and these two states are compared to each other, which yields results that are less sensitive to fluctuations in resistance from device to device. This enables device to device dispersion in the resistances and magnetoresistance amplitudes to be further tolerated and thus enables the manufacturing process to be made less difficult, particularly in the context of manufacturing high-density MRAM chips. On the other hand, this second embodiment makes the reading slower than the first embodiment since this self-differential reading in fact implements two writings, two readings and one comparison of the two readings.

To improve the reading speed of the magnetic device according to this second embodiment, the information contained in the storage layer may be read dynamically. To do this, a current pulse is sent through the magnetic device, this current pulse performing an oscillation, which creates a voltage pulse at the terminals of the device. The voltage pulse thus created may present a voltage peak that is either positive or negative, depending on whether the magnetizations of the storage and reference layers are parallel or antiparallel. The sign of this voltage peak thus enables the magnetization direction of the storage layer to be known more quickly.

According to different embodiments, the storage layer may be constituted of a single magnetic layer or else it may be constituted of a stack of layers.

According to one embodiment, the storage layer comprises at least one stack formed by:
 a transition layer constituted of a ferromagnetic material presenting a face-centered cubic crystal structure in contact with the first antiferromagnetic layer;
 an amorphous or quasi-amorphous layer in contact with the transition layer;
 a ferromagnetic storage layer.

Thus, a structural transition exists between the first antiferromagnetic layer that is face-centered cubic, and the layers that present a body-centered cubic crystal structure.

According to another embodiment, the storage layer is constituted of a three-layer synthetic antiferromagnetic stack comprising first and second magnetic layers separated by a non-magnetic conductive layer able to induce antiparallel coupling between the magnetizations of adjacent magnetic layers.

Advantageously, the three-layer synthetic antiferromagnetic stack presents a non null magnetic moment result. In fact, so that the leakage magnetic field issued from the stabilization layer can have an effect on the storage layer, the storage layer must present a non null magnetic moment result. To do this, the two magnetic layers of the three-layer synthetic antiferromagnetic stack must not present magnetic moments that are completely cancelled out. To do this, the two magnetic layers of the three-layer synthetic antiferromagnetic stack may for example present different thicknesses. However, in this reasoning, due account should be given to the fact that the magnetic layer of the three-layer synthetic antiferromagnetic stack in contact with the antiferromagnetic layer is closer to the stabilization layer than the other magnetic layer of this three-layer stack. Consequently, the leakage field radiated by the magnetization of the stabilization layer on the layer in contact with the antiferromagnetic layer is slightly higher than that radiated on the other constituent magnetic layer of the three-layer stack.

By calling the magnetic layer from the three-layer synthetic antiferromagnetic stack that is in contact with the spacer the "first magnetic layer," and the layer from the synthetic antiferromagnetic stack that is in contact with the first antiferromagnetic layer the "second magnetic layer," then advantageously the first magnetic layer from the three-layer synthetic antiferromagnetic stack presents a higher magnetic moment than the magnetic moment of the second magnetic layer from the three-layer synthetic antiferromagnetic stack. Thus, the leakage magnetic field created by the stabilization layer when it is subjected to an external magnetic field orients the magnetization direction of the first magnetic layer in an antiparallel manner to the magnetization direction of the stabilization layer. This has the effect of orienting the magnetization of the second magnetic layer parallel to that of the stabilization layer.

According to an embodiment, the reference layer is constituted of a three-layer synthetic antiferromagnetic stack comprising two magnetic layers separated by a non-magnetic conductive layer able to induce antiparallel coupling between the magnetizations of adjacent magnetic layers.

The invention also relates to a magnetic memory with thermally assisted writing in which each memory point is constituted of a magnetic device according to the invention.

Figure 6:
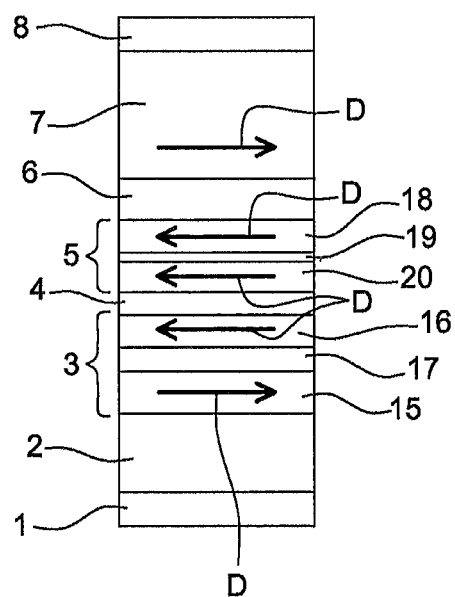
Figure 7:
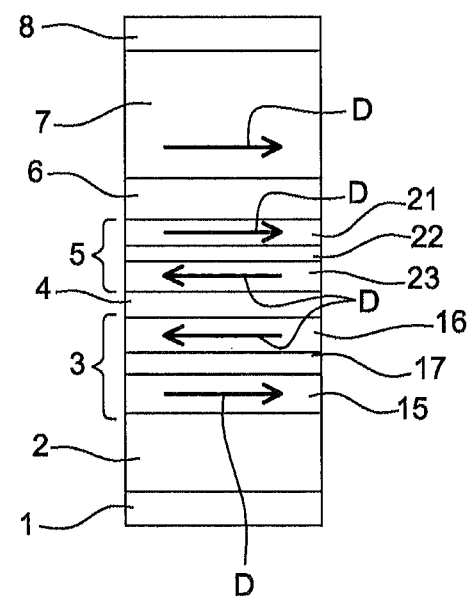

Other characteristics and advantages of the invention will emerge upon reading the following description, with reference to the attached figures, that illustrates:

FIG. 1, a cross sectional view of a magnetic device according to a first embodiment of the invention;

FIG. 2, a top view of the magnetic device from FIG. 1;

FIG. 3, a schematic cross sectional view of the interface between the first antiferromagnetic layer of the device from FIG. 1 and the stabilization layer on one side and the storage layer on the other side;

FIG. 4, a cross sectional view of a magnetic device according to another embodiment of the invention;

FIG. 5, a cross sectional view of the device from FIG. 4 when information is written in the storage layer;

FIG. 6, a cross sectional view of a magnetic device according to another embodiment of the invention;

FIG. 7, a cross sectional view of a magnetic device according to another embodiment of the invention.

For more clarity, identical or similar elements are marked by identical reference signs on all of the figures.

In all the figures, arrows that bear the reference "D" represent the magnetization direction of the layer on which they are situated. Arrows noted "I" represent electron currents.

In all of the embodiments described with reference to the figures, the magnetic layers present a magnetization direction in the plane, i.e., the magnetizations of the magnetic layers are parallel or antiparallel to the plane in which each layer is found. However, the magnetic device according to the invention may also be made with the magnetizations outside of the plane, i.e., the magnetizations of the magnetic layers would be perpendicular to the plane in which the magnetic layers are found.

FIGS. 1 and 2 represent a magnetic device according to one embodiment of the invention. This magnetic device comprises a buffer layer 1 that is used as a base for growing other layers of the magnetic device. This buffer layer 1 is preferably made in a non-magnetic material. It may for example be made in a nickel-iron-chromium alloy containing at least 20% Cr, or in copper nitride or it may have a multilayer structure constituted of alternating copper layers and tantalum layers. Of course, these materials are given only by way of illustration, without restricting the invention.

The magnetic device also comprises a covering layer 8 that protects the stack of layers of the magnetic device from oxidation or ensures, if necessary, the electrical connection of the stack with the upper electrode of the stack. This covering layer 8 may for example be constituted of tantalum, copper nitride or may have a multilayer structure constituted of alternating copper layers and tantalum layers.

Between buffer layer 1 and covering layer 8, the magnetic device then comprises a second antiferromagnetic layer 2 that is disposed against buffer layer 1. This second antiferromagnetic layer 2 may be for example in PtMn with a thickness of between 12 and 30 nm or in MiMn with a thickness of between 20 nm and 50 nm. The second antiferromagnetic layer 2 is preferably made in an antiferromagnetic material that presents a high Néel temperature, typically equal to or greater than 350° C. The materials cited above for the antiferromagnetic layer 2 are only given for illustrative purposes and other materials may be used without departing from the scope of the invention.

The magnetic device then comprises a reference layer 3 in contact with the second antiferromagnetic layer 2. The reference layer 3 may be a single layer, or else it may be constituted of a stack of layers, and particularly it may be constituted of a three-layer synthetic antiferromagnetic stack as represented in FIG. 1. The three-layer synthetic antiferromagnetic stack represented in FIG. 1 is constituted of two magnetic layers 9 and 11 separated by a non-magnetic conductive layer 10 able to induce an antiparallel alignment between the magnetizations of adjacent magnetic layers. The magnetic layer 9 may for example be constituted of a cobalt-iron alloy, while the magnetic layer 11 may be constituted of a cobalt-iron-boron alloy, or vice-versa. The two magnetic layers 9 and 11 may also be made of the same magnetic alloy. Each magnetic layer 9 and 11 preferably presents a thickness of between 1 and 4 nm. The two magnetic layers 9 and 11 preferably present similar thicknesses, such that the field radiated by the assembly of the two magnetic layers 9 and 11 at the level of the storage layer 5 is as weak as possible. The non-magnetic conductive layer 10 may for example be made of ruthenium with a thickness of between 0.5 nm and 0.9 nm, thicknesses for which it is known that ruthenium induces antiparallel coupling between magnetizations of adjacent magnetic layers. The two magnetic layers 9 and 11 are coupled in an antiparallel manner through the non-magnetic conductive layer 10. The magnetization direction of the two magnetic layers 9 and 11 is pinned by the second antiferromagnetic layer 2, while the magnetic device is at a temperature of less than the Néel temperature of the antiferromagnetic material that constitutes the second antiferromagnetic layer 2. The constituent materials of the reference layer are well known to the person skilled in the art and are given here for indicative purposes only, without necessarily restricting the invention.

The magnetic device then comprises a storage layer 5 separated from the reference layer 3 by a spacer 4. The spacer 4 may be a tunnel barrier selected from the group comprising aluminum oxide $AlO_x$, titanium oxide $TiO_x$ and magnesium oxide MgO. Alternately, spacer 4 may be constituted of a semiconductor. Thus, the spacer may be constituted of silicon, germanium or GaAs. The spacer 4 may also be made in a heterogeneous metal/oxide layer such as a confined current path layer constituted of an insulating barrier, for example in alumina with a thickness of 2 nm pierced by conducting channels that are for example in copper with a nanometric diameter, typically between 1 and 4 nm. Spacer 4 preferably presents a thickness of between 0.6 nm and 5 nm.

The storage layer 5 is a magnetic layer that presents a variable magnetization direction. This storage layer 5 may be a magnetic single layer or a stack of layers. The storage layer 5 may for example be constituted of a stack of layers comprising:
- a transition layer constituted of a ferromagnetic material presenting a face-centered cubic crystal structure in contact with the first antiferromagnetic layer;
- an amorphous or quasi-amorphous layer in contact with the transition layer;
- a ferromagnetic layer with a body-centered cubic crystal structure.

This type of storage layer is particularly interesting in the case where the spacer 4 is a MgO-based tunnel barrier whose crystal structure is body-centered cubic.

The storage layer 5 may also be constituted of a three-layer synthetic antiferromagnetic stack.

In the example from FIG. 1, the storage layer 5 is constituted of a single layer. This single layer may for example be constituted of a cobalt-iron-boron alloy. The storage layer preferably presents a thickness of between 1 and 4 nm.

Of course, the characteristics of the storage layer are given here only for indicative purposes and the person skilled in the art would know to adapt the invention to other types of storage layers.

The magnetic device next comprises, in contact with the storage layer 5, a first synthetic antiferromagnetic layer 6 that enables the magnetization direction of the storage layer 5 to be pinned during reading, and that enables the magnetization direction of the storage layer 5 to be released during writing. The first antiferromagnetic layer 6 may for example be in IrMn with a thickness of between 5 and 7 nm or in FeMn with a thickness typically of between 7 and 12 nm. The first antiferromagnetic layer 6 preferably presents a Néel temperature that is sufficiently high so that in the absence of heating, the first antiferromagnetic layer 6 traps the magnetization of the storage layer 5. However, this Néel temperature should not be too high so that it is not too difficult to release the magnetization direction of the storage layer 5, but also to be able to release the magnetization direction of the storage layer 5 without releasing the magnetization direction of the reference layer 3. Thus, the first antiferromagnetic layer 6 preferably presents a Néel temperature of between 200 and 300° C. The first antiferromagnetic layer 6 may for example be made in an iridium-manganese, iron-manganese alloy or in an iridium-manganese-chromium alloy with a weight percent of chromium of between 10 and 25%.

The magnetic device also comprises, in contact with the first antiferromagnetic layer 6, a stabilization layer 7 made in a ferromagnetic material. This stabilization layer 7 may for example be made in a cobalt-iron, NiFe or CoFeB alloy.

The magnetic device preferably presents an elliptic section, as can be seen more precisely in, FIG. 2, or at least shape anisotropy in its plane in order to reduce to the maximum the risk that the stabilization layer 7 enters the vortex state.

The stabilization layer 7 reinforces the magnetic coherence of the first antiferromagnetic layer 6 and it increases the pinning of the magnetization direction of the storage layer 5 by the first antiferromagnetic layer 6.

This phenomenon will be explained in more detail with reference to FIG. 3 that schematically represents, at the microscopic level, the storage layer 5, the first antiferromagnetic layer 6 and the stabilization layer 7. Each of these layers is constituted of grains, respectively 5a to 5d, 6a to 6d and 7a to 7d. Each grain 5a to 5d, 6a to 6d, 7a to 7d is a monocrystalline domain that substantially presents the same crystallographic orientation. Within a same layer, for example within the first antiferromagnetic layer 6, two adjacent grains, for example 6a and 6b, are separated by a grain boundary 6e. Each grain boundary 6e is thus a zone in which one crystallographic orientation passes to another crystallographic orientation.

In the absence of a stabilization layer, two adjacent grains from the first antiferromagnetic layer 6 are very weakly magnetically coupled, that is why the magnetic coherence of the first antiferromagnetic layer 6 is weak. In other words, the coupling energy $A_{AF/AF}$ between two grains from the first antiferromagnetic layer in the absence of the stabilization layer is very weak, for example on the order of $10^{-3}$ erg/cm$^2$.

In this document, the term "coupling energy" between two grain boundaries is the coupling energy per unit of surface area. This energy is expressed in erg/cm$^2$.

Within the stabilization layer 7, which is ferromagnetic, the grains are very strongly coupled. Thus, the coupling energy $A_{F/F}$ between two adjacent grains of the stabilization layer is approximately $10^4$ to $10^5$ times higher than the coupling energy $A_{AF/AF}$ between two grains from the first antiferromagnetic layer in the absence of the stabilization layer. In fact, the coupling energy $A_{F/F}$ between two adjacent grains of the stabilization layer is on the order of magnitude of 10 erg/cm$^2$, while the coupling energy $A_{AF/AF}$ between two grains from the first antiferromagnetic layer in the absence of the stabilization layer is on the order of magnitude of $10^{-3}$ erg/cm$^2$.

Thus, to increase the coupling between the grains from the first antiferromagnetic layer 6, the invention proposes adding a ferromagnetic stabilization layer 7 on the first antiferromagnetic layer 6.

As may be seen schematically in FIG. 3, when the stabilization layer 7 is deposited on the first antiferromagnetic layer 6, grains 7a, 7b, 7c, 7d from the stabilization layer 7 align with grains 6a, 6b, 6c, 6d from the first antiferromagnetic layer 6. This aforementioned columnar growth is characteristic of this type of stack, the deposition of which is often done by cathode sputtering. Each grain from the stabilization layer, for example 7a, is magnetically coupled with grain 6a from the first antiferromagnetic layer 6 above which it is found. Thus, the energy coupling $A_{AF/F}$ between a grain from the stabilization layer and the grain from the first antiferromagnetic layer above which it is found is on the order of magnitude of $10^{-1}$ to some $10^{-1}$ erg/cm$^2$.

Consequently, the grains from the first antiferromagnetic layer 6 are coupled to each other through interfacial coupling between the grains from the stabilization layer and the first antiferromagnetic layer and the intergrain coupling between the grains from the stabilization layer.

The presence of the ferromagnetic stabilization layer thus enables the existence of effective coupling between the grains from the first antiferromagnetic layer. This coupling ensures that the grains from the first antiferromagnetic layer that would be magnetically unstable without the stabilization layer become magnetically stable in the presence of the stabilization layer due to the onset of intergrain coupling induced by the stabilization layer. This particularly relates to the grains at the border of the device, the size of which could sharply reduce during the etching process of the device.

In addition, as will be seen more precisely with reference to FIG. 4, the stabilization layer may enable information to be written in the storage layer by using a weaker magnetic field than if the stabilization layer were not present.

The explanation is given with reference to the magnetic device from FIG. 4 that comprises a reference layer 3 whose magnetization direction is not pinned by an antiferromagnetic layer. But the principle of writing would be the same if the reference layer 3 were pinned by a second antiferromagnetic layer. With reference to FIG. 4, the reference layer 4 presents a variable magnetization direction. This reference layer 4 may be a single layer or a multilayer.

The magnetic device from FIG. 4 also comprises a storage layer 5 whose magnetization direction is variable. The storage layer 5 may be a single layer or a multilayer, but it must present a non null magnetic moment result to be sensitive to the magnetic field radiated by the stabilization layer 7.

The reference layer 3 and the storage layer 5 are separated by a spacer 4.

The magnetic device from FIG. 4 also comprises a first antiferromagnetic layer 6 in contact with the storage layer 5, as well as a stabilization layer 7 in contact with the first antiferromagnetic layer 6.

The stabilization layer 7 presents a total magnetic moment that is higher than the storage layer 5.

To do this, the stabilization layer 7 may for example present a thicker thickness than the thickness of the storage layer. The stabilization layer 7 preferably presents a thickness of between 5 and 20 nm, for example equal to 7 nm, while the storage layer preferably presents a thickness of between 1 and 4 nm, for example equal to 3 nm.

The stabilization layer may for example be a cobalt-iron alloy or a nickel-iron or nickel-iron-cobalt or cobalt-iron-boron alloy and the storage layer may be in a cobalt-iron-boron or cobalt-iron alloy.

In addition, the magnetic device may also comprise a buffer layer 1 and a covering layer 8 on both sides of the device.

FIG. 5 schematically represents a writing method of the device from FIG. 4.

To enable writing of information in the storage layer, the magnetic device comprises a transistor 12 that is conductive in the writing mode. In addition, the magnetic device comprises a conductive line 13 situated below the magnetic stack. The first conductor 13 is arranged such that, when it is crossed by an electric current, it creates a magnetic field that is parallel or antiparallel to the magnetization direction of the stabilization layer. When writing, the transistor 12 is in on mode such that a current may circulate through the stack causing heating of the storage layer and of the first antiferromagnetic layer by the Joule effect. This heating reaches a temperature equal to or greater than the Néel temperature of the first antiferromagnetic layer. It will be noted that in writing mode, the first antiferromagnetic layer should be heated to an aforementioned blocking temperature (that may be less than the Néel temperature) such that the magnetization direction of the storage layer 5 is no longer pinned.

To write information in the storage layer, a current is sent through the conductor 13 and through the stack, the transistor 12 being on. The stack then is heated to a temperature greater than the Néel temperature of the first antiferromagnetic layer 6, such that the first antiferromagnetic layer 6 becomes paramagnetic and that the magnetization direction of the storage layer 5 is no longer pinned.

Simultaneously, a magnetic field B is created by the first conductor 13. This magnetic field B acts on the stabilization layer 7 since it presents a high magnetic moment due to its significant thickness. The magnetization direction of the stabilization layer 7 is then aligned parallel to the magnetic field.

The stabilization layer 7 then radiates a leakage magnetic field B' that tends to align the magnetization direction of the storage layer 5 antiparallel to the magnetization direction of the stabilization layer 7.

In fact, the magnetic field B created by the first conductor 13 presents an intensity of between 2 mT and 7 mT while, when the stabilization layer 7 presents a thickness greater than 7 nm, the leakage magnetic field B' presents an intensity of at least 20 mT. The leakage magnetic field B' is thus higher than the magnetic field B, which means that the storage layer essentially feels this leakage magnetic field B'.

Thus, the stabilization layer 7 serves as a magnetic field amplifier felt by the storage layer 5 and consequently, it controls the magnetization direction of storage layer 5 more effectively than in the absence of the stabilization layer. The act of using the magnetic field B' radiated from the stabilization layer to act on the magnetization of the storage layer rather than the field created by the current line 13 directly enables a stronger field to be created and thus puts the magnetization of the storage layer in a micromagnetic configuration closer to a monodomain, i.e., better saturated, than with the single field generated by the conductive line 13.

In addition, the stabilization layer 7 is particularly advantageous since the leakage magnetic field B' that it creates is relatively uniform, even if the initial magnetic field B was not, which enables storage layer 5 to have a uniform magnetization.

Once the magnetization direction of the storage layer 5 is placed in the intended direction, the current crossing the stack is cut to enable the stack to cool in the presence of the magnetic field and then the current in the conductor 13 is cut to eliminate the applied field. The first antiferromagnetic layer 6 having become antiferromagnetic again, it traps the magnetization direction of the storage layer 5 in the direction in which it is found.

It should be noted that during this writing, the reference layer thus switches the direction of the local field created by conductor 13 and partially radiated by the other layers but this does not matter since the magnetization of this layer will then be reoriented in a predetermined direction during reading.

Then, to read the information contained in storage layer 5, a differential reading may be done thanks to the reference layer 3. To do this, the level of resistance of the tunnel junction formed by the magnetic device is compared for two different orientations of the magnetization direction of reference layer 3. To do this, the magnetization direction of the reference layer 3 is oriented in a first predetermined direction with a first magnetic field pulse produced by a first current pulse in conductor 13. This orientation of the magnetization direction of reference layer 3 takes place without causing the current to circulate through the stack to not heat it and thus to not modify the magnetization direction of the storage layer 5. Thus the resistance of the magnetic device is measured by using a weaker reading current, typically divided by a factor 2, than the heating current used when writing. Next a second magnetic field pulse generated by a second current pulse is applied in conductor 13 opposite from the first pulse, still without heating, so as to orient the magnetization direction of the reference layer 3 in the direction opposite from the first predetermined direction. Then the resistance of the magnetic device is again measured. After each current pulse, the magnetization direction of the reference layer 3 is known since the direction of the applied magnetic field pulses is known. Consequently, by comparing the resistance of the magnetic device after the first current pulse and after the second current pulse, the magnetization direction of the storage layer 5 and thus the information contained in storage layer 5 is deduced.

FIG. 6 represents another embodiment of the invention in which the magnetization direction of the reference layer 3 is pinned by a second antiferromagnetic layer 2. The reference layer 3 is in this example constituted of a three-layer synthetic antiferromagnetic stack that comprises two magnetic layers 15 and 16 coupled in an antiparallel manner through a non-magnetic conductive layer 17, for example in ruthenium with a thickness of between 0.5 nm and 0.9 nm. The first magnetic layer 15 in contact with the second antiferromagnetic layer is for example constituted of a cobalt-iron alloy, while the second magnetic layer 16 in contact with spacer 4 is for example constituted of a cobalt-iron-boron alloy.

The storage layer 5 in this embodiment is also a multilayer. More precisely, the storage layer 5 comprises:
- a transition layer 18 constituted of a ferromagnetic material presenting a face-centered cubic crystal structure; the transition layer 18 is in contact with the first antiferromagnetic layer 6; the transition layer 18 is for example in a nickel-iron, cobalt-iron or nickel-iron-cobalt alloy; the transition layer 18 may for example be made in a $Ni_{80}Fe_{20}$, or $Co_{90}Fe_{10}$ alloy;
- an amorphous or quasi-amorphous layer 19 in contact with the transition layer 18; this amorphous or quasi-amorphous layer 19 may for example be made in tantalum (Ta), copper (Cu), ruthenium (Ru), silica (SiO2), tantalum oxide (TaO), aluminum oxide (AlOx), zirconium oxide ($ZrO_x$), titanium oxide ($TiO_x$), hafnium oxide ($HfO_x$), tantalum nitride (TaN), titanium nitride (TiN), transition metals Co, Fe or Ni with the addition of boron, zirconium, niobium or hafnium in total proportions of added elements from 5 to 30 atomic % or an alloy of these compounds;
- a ferromagnetic layer with a body-centered cubic structure, that may for example be made of a cobalt-iron-boron or CoFe alloy containing at least 30% Fe.

The storage layer formed by these three layers 18, 19, 20 preferably presents a total thickness of between 1.5 and 5 nm.

The transition layers 18 and amorphous or quasi-amorphous layers 19 enable a structural transition to be produced between the first antiferromagnetic layer 6 that presents a face-centered cubic crystal structure and the ferromagnetic layer that presents a body-centered cubic structure in the frequently encountered case where the spacer is an MgO-based tunnel barrier with a body-centered cubic symmetry.

To write information in the storage layer, one may either use the stabilization layer as described with reference to FIG. 5, or use the reference layer as in the embodiments from the prior art. In fact, in this embodiment, the magnetization direction of the reference layer is pinned and consequently, it may be used to write information in the storage layer. To do this, one may for example apply an external magnetic field to the magnetic device as described in relation to FIG. 5. But it is also possible to write by causing an electron current to circulate through the layers of the magnetic device, perpendicularly to the layers, in one direction or the other, i.e., from bottom to top or from top to bottom depending on whether one wants to make the magnetization of the storage layer parallel or antiparallel to that of the reference layer. This current has a dual effect. First of all, independently of its sense of direction, it causes, by the Joule effect at the level of the tunnel barrier 4, heating of the structure above the Néel temperature of the antiferromagnetic layer 2. This has the effect of releasing the magnetization of the storage layer that is no longer pinned by the interaction with the antiferromagnetic layer 2. In addition, when this electron current crosses the reference layer that is magnetic, the electron spins will be spin polarized, such that the electrons will leave this reference layer with a polarized spin. When these electrons cross the storage layer, they will undergo exchange interactions with the spins responsible for the magnetization of the storage layer. If the current density is sufficiently high, this will cause a reorientation of the magnetization of this layer and an alignment of the magnetization of the storage layer by transfer from the angular momentum of polarized electrons to the magnetic moment of the storage layer. This phenomenon is known by the name spin transfer. Thus, if the electron current circulates from the reference layer to the storage layer, the spin transfer will promote the parallel orientation of storage and reference layer magnetizations. On the other hand, if the electron current circulates from the storage layer to the reference layer, the antiparallel alignment is promoted. In this writing mode, the spin transfer is exerted above all on the magnetization of the storage layer. Then the magnetization of the stabilization layer is reoriented in an antiparallel manner to the magnetization of the storage layer due to the magnetostatic interaction between these two layers. In this writing mode, the stabilization layer still plays the role of stabilizing the antiferromagnetic layer 2 by inducing effective intergrain coupling within this layer. However, the lever effect exerted by the magnetization of this layer to cause the magnetization of the storage layer to switch during field writing is no longer operative during spin transfer writing.

In reading mode, an electron current is sent through the layers and the resistance of the magnetic device is measured. This reading current has a weaker intensity than the writing current (typically at least 50%) to not risk disturbing by spin transfer the magnetic orientation of the storage layer when reading. Then the resistance measured is compared to a standard reference value. If the measured resistance is greater than this standard reference value, this means that the storage layer presents a magnetization direction antiparallel to that of the reference layer. If the measured resistance is less than this standard reference value, this means that the reference and storage layers present parallel magnetization directions.

FIG. 7 represents a magnetic device according to another embodiment in which the storage layer is constituted of a three-layer synthetic antiferromagnetic stack comprising first and second magnetic layers 23 and 21 separated by a non-magnetic 22 conductive layer 5 able to induce antiparallel coupling between the magnetizations of adjacent layers. Advantageously, the first magnetic layer 23, that is in contact with spacer 4, presents a higher magnetic moment than the magnetic moment of the second magnetic layer 21, that is in contact with the first antiferromagnetic layer, such that the leakage magnetic field, that is radiated by the stabilization layer, orients the magnetization of the first magnetic layer 23 that is in contact with spacer 4.

This embodiment enables less magnetization distortion towards the edges of the magnetic device thanks to a partial magnetic flux closing phenomenon between layers 21 and 23. In addition, when the first antiferromagnetic layer 6 comprises manganese, the non-magnetic conductive layer 22 for example in ruthenium prevents the manganese coming from the antiferromagnetic layer 2 from diffusing through the magnetic device.

Naturally, the invention is not limited to the embodiments described with reference to the figures and variations may be contemplated without departing from the scope of the invention. In particular, the materials and thicknesses chosen to produce the buffer layers, reference layers, storage layers and spacers are given here for illustrative purposes only and other materials or thicknesses may be utilized.

The invention claimed is:

1. A thermally assisted magnetic writing device comprising:
   a first magnetic layer;
   a second magnetic layer that presents a variable magnetization direction;
   a spacer arranged between the first magnetic layer and the second magnetic layer;
   a first antiferromagnetic pinning layer in contact with the second magnetic layer, the first antiferromagnetic layer being able to trap the magnetization direction of the second magnetic layer;
   a heating device configured to heat said pinning layer such that, during heating, the temperature of said pinning layer exceeds its blocking temperature such that the magnetization direction of said second magnetic layer is no longer pinned;
   a stabilization layer made in a ferromagnetic material, the stabilization layer being in contact with the first antiferromagnetic layer by its face opposite from the second magnetic layer.

2. The magnetic device according to claim 1, wherein the stabilization layer presents a higher magnetic moment than a magnetic moment of the second magnetic layer.

3. The magnetic device according to claim 1, wherein the device presents shape anisotropy in its plane.

4. The magnetic device according to claim 1, wherein the stabilization layer presents a variable magnetization direction, the magnetic device comprising a magnetic field emitter configured to modify the magnetization direction of the stabilization layer.

5. The magnetic device according to claim 1, wherein the first magnetic layer presents a magnetization direction pinned by a second antiferromagnetic layer disposed in contact with the first magnetic layer.

6. The magnetic device according to claim 1, wherein the first magnetic layer presents a variable magnetization direction.

7. The magnetic device according to claim 1, wherein the second magnetic layer comprises at least one stack formed by:
   a transition layer constituted of a ferromagnetic material presenting a face-centered cubic crystal structure in contact with the first antiferromagnetic layer;
   an amorphous or quasi-amorphous layer in contact with the transition layer;
   a ferromagnetic storage layer.

8. The magnetic device according to claim 1, wherein the second magnetic layer is constituted of a three-layer synthetic antiferromagnetic stack comprising first and second magnetic layers separated by a non-magnetic conductive layer.

9. The magnetic device according to claim 8, wherein the three-layer synthetic antiferromagnetic stack presents a non null magnetic moment result.

10. The magnetic device according to claim 9, wherein the first magnetic layer of the three-layer synthetic antiferromagnetic stack is in contact with the spacer, the second magnetic layer of the synthetic antiferromagnetic stack being in contact with the first antiferromagnetic layer, the first magnetic layer of the three-layer synthetic antiferromagnetic stack presenting a higher magnetic moment than the magnetic moment of the second magnetic layer of the three-layer synthetic antiferromagnetic stack.

11. The magnetic device according to claim 1, wherein the first magnetic layer is constituted of a three-layer synthetic antiferromagnetic stack comprising two magnetic layers separated by a non-magnetic conductive layer.

12. A magnetic memory with thermally assisted writing in which each memory point is constituted of a magnetic device according to claim 1.

13. The magnetic device according to claim 1, wherein the heating device includes a transistor.

14. The magnetic device according to claim 1, wherein heating of the pinning layer is carried out by a current flowing in the pinning layer.

15. The magnetic device according to claim 1, wherein the heating device is adapted to provide a current to heat the pinning layer.

16. The magnetic device according to claim 4, wherein the magnetic field emitter comprises a conductor in which, in use, an electrical current passes.

17. The magnetic device according to claim 16, wherein the conductor is coated on some of its faces by a soft magnetic material enabling the field created at the level of the stabilization layer to be increased.

* * * * *